US005874383A

United States Patent [19]
Hermann et al.

[11] Patent Number: 5,874,383
[45] Date of Patent: Feb. 23, 1999

[54] TIBIBACACUO BASED SUPERCONDUCTORS

[75] Inventors: Allen M. Hermann; Veeraraghavan Badri, both of Boulder, Colo.

[73] Assignee: University Technology Corporation, Boulder, Colo.

[21] Appl. No.: 835,484

[22] Filed: Apr. 8, 1997

[51] Int. Cl.[6] .................................................. C01F 11/02
[52] U.S. Cl. ........................ 505/120; 505/121; 505/783; 505/782
[58] Field of Search ................................. 505/120, 121, 505/783, 782; 427/62

[56] References Cited

U.S. PATENT DOCUMENTS

| | | | |
|---|---|---|---|
| 5,264,414 | 11/1993 | Subramanian | 505/120 |
| 5,462,922 | 10/1995 | Doi et al. | 505/120 |

OTHER PUBLICATIONS

Sleight et al, "High Tc Bismuth and thallium Copper Oxide Superconductors", MRS Bulletin, Jan. 1989 pp. 45–48.

Fossheim, Kristian et al. "Enhanced Flux Pinning in $Bi_2Sr_2CaCu_2O_{8+x}$ Superconductor with Embedded Carbon Nanotubes," Physica C 248, 1995, pp. 195–202.

Gladyshevskii, R.E. et al. "Preparation By In–Situ Reaction and Physical Characterization of Ag(Au) and Ag(Pd) Sheathed (Tl Pb,Bi) $(Sr,Ba)_2Ca_2Cu_3O_{9\delta}$ Tapes," Physica C 255, 1995, pp. 113–123.

Hur, N.H. et al. "Structure and Superconducting Properties of $(Tl_{0.8}Bi_{0.2})(Sr_{1.6}Ba_{0.4})Ca_2Cu_3O_{9-\delta}$," Physica C 253, 1995, pp. 109–114.

Jorgensen, J.D. "Structural Features that Optimize High Temperature Superconductivity," presented at the First Polish–US Conference on High–temperature Superconductivity, Sep. 11–15, 1995, 17 pages.

Kaneko, Tetsuyuki et al. "(Tl, Pb,Bi)$Sr_2Ca_2Cu_3O_z$ Superconductors with Zero Resistance at 120K," Appl. Phys. Lett 56, Mar. 26, 1990, pp. 1281–1283.

Kim, D.H. et al. "Effect of Cu–O Layer Spacing on the Magnetic Field Induced Resistive Broadening of High–Temperature Superconductors," Apr. 1991, pp. 431–437.

Kim, Y.C. et al. "Enhanced Irreversibility Field and Current Stabilizationby Pb Substitution in Aligned Tl–1223 High $T_c$ Superconductor," Physica C 253, Jul. 1995, pp. 257–366.

König, W.T. et al. "Influence of the Tl–Content on the Properties of Bi–Doped Tl–1223 Superconductors," Physica C 258, 1996, pp. 175–182.

Kroeger D.M. et al. "Local Texture and Percolative Paths for Long–Range Conduction in High Critical Current Density $TlBa_2Ca_2Cu_3O_{8+x}$ Deposits," Appl. Phys. Lett 64, Jan. 3, 1994, pp. 106–108.

Krusin–Elbaum, L. et al. "Enhancement of Persistent Currents in $Bi_2Sr_2CaCu_2O_8$ Tapes with Splayed Columnar Defects Induced with 0.8 GeV Protons," Appl. Phys. Lett. 64, Jun. 13, 1994, pp. 3331–3333.

Kung, P.J. et al. "Granularity, Microstructure and Flux Creep in $TlBa_2Ca_2Cu_3O_{9+\delta}$ Superconducting Powder and Silver–Sheathed Tapes," Physica C 220, 1994, pp. 310–322.

Lee, D.F. et al. "Influences of $Y_2BaCuO_5$ Particle Size and Content on the Transport Critical Current Density of $YBa_2Cu_3O_x$ Superconductor," Physica C 202, 1992, pp. 83–96.

Liu, R.S. et al. "High Critical–Current Densities in $(Tl_{0.5}Pb_{0.5})Sr_2Ca_2Cu_3O_9$ With $T_c$ up to 115K," Appl. Phys. Lett 60, Feb. 24, 1992, pp. 1019–1021.

Michel, C. et al. "Stabilization of Mercury Cuprates by Bismuth—The Superconductors $Hg_{1-x}Bi_xBa_2Ca_{m-1}Cu_mO_{2m+2+\delta}$" Physica C 241, 1995, pp. 1–9.

Murakami, M. "Melt Processing of YBaCuO Superconductors and Critical Currents," Modern Physics Letters B vol. 4, No. 3, 1990, pp. 163–179.

Okada, Michiya et al. "Ag–Sheathed Tl–Ba–Ca–Cu–O Superconductor Tape with $T_c \approx 120K$," Journal of Applied Physics, vol. 27, No. 12, Dec. 1988, pp. L2345–L2347.

Ren, Z.F. et al. "Enhanced Formation of 1223–phase By Partial replacement of Bi for Tl in In–Situ Synthesized Silver–Sheathed Superconducting Tape of $Tl_{1-x}Bi_xSr_{2-y}Ba_yCa_2Cu_3O_{9-\delta}$," Physica C 216, 1993, pp. 199–204.

Ren, Z.F. et al. "Superconducting Epitaxial (Tl,Bi) $Sr_{1.6}Ba_{0.4}Ca_2Cu_3O_{9-\delta}$ Film with High Critical Current in Magnetic Field," Appl. Phys. Lett 65, Jul. 11, 1994, pp. 237–239.

Ren, Z.F. et al. "Uniform and Flexible 24–Meter Superconducting Tape of Silver–Sheathed $Tl_{0.5}Pb_{0.5}Ba_{0.4}Sr_{1.6}Ca_2Cu_3O_{8.2}$" Appl. Phys. Lett. 61, Oct. 5, 1992, pp. 1715–1717.

Schwartz, Justin et al. "Enhanced Flux–Line Pinning in $Bi_2Sr_2CaCu_2O_x$ By Neutron Irradiation and Li(n,$^3$T)α Reaction–Induced Charged–Particle Defects," J. Appl. Phys. Feb. 1, 1993, pp. 1343–1347.

Schwartz, J. et al. "Large Critical Current Density in Neutron–Irradiated Polycrystalline $HgBa_2CuO_{4+\delta}$," The American Physical Society, Oct. 1, 1993, pp. 9932–9934.

Shimoyama, J. et al. "A New Mercury–Based Superconductor: $(Hg,Cr)Sr_2CuO_y$," Physica C 224, 1994, pp. 1–5.

Sung, Y.S. et al. "The Effects of Carbon on $TlBa_2Ca_2Cu_3O_x$ Phase Formation in the $TlF–Ba_2Ca_2Cu_3O_z$ System," Appl. Phys. Lett. 69, Nov. 25, 1996, pp. 3420–3422.

Thompson, J.R. et al. "Enhanced Current Density $J_c$ and Extended Irreversibility in Single–Crystal $Bi_2Sr_2CaCu_2O_8$ via Linear Defects from Heavy on Irradiation," Appl. Phys. Lett. 60, May 4, 1992, pp. 2306–2308.

Tkaczyk, J.E. et al. "Transport Critical Currents in Spray Pyrolyzed Films of $TlBa_2Ca_2Cu_3O_z$ on Polycrystalline Zirconia Substrates," Appl. Phys. Lett. 61 Aug. 3, 1992, pp. 610–612.

(List continued on next page.)

Primary Examiner—Roy V. King
Attorney, Agent, or Firm—Hill & Simpson

[57] ABSTRACT

A high temperature superconductor system having the single phase composition TlBiBaCaCuO. The system exhibits a $T_c$ of at least 116 K.

5 Claims, 6 Drawing Sheets

OTHER PUBLICATIONS

Willis, J.O. et al. "Transport and Magnetization Critical Current Densities in TlBa$_2$Ca$_2$Cu$_3$O$_x$ Tapes," 1993, pp. 1219–1221.

Wu, S. et al. "Superconducting Properties and Microstructural Evolution of Li Doped Bi$_2$Sr$_2$CaCu$_2$O$_x$," *Physica C 246*, 1995, pp. 297–308.

Yang, Peidong et al. "Nanorod–Superconductor Composites: A Pathway to Materials with High Critical Current Densities," *Science,* vol. 273, Sep. 27, 1996, pp. 1836–1839.

$Tl_{0.95}Bi_{0.05}Ba_2Ca_2Cu_3O_9$

111K

M vs H plot for Tl0.8Bi0.2Ba2Ca2Cu3O9 system at 10K

M vs H plot for $Tl0.8Bi0.2Ba2Ca2Cu3O9$ system at 77K

TIBIBACACUO BASED SUPERCONDUCTORS

CONTRACTUAL RIGHTS

The U.S. Office of Naval Research has rights to the inventions pursuant to Contract No. N00014-90-J-1571.

BACKGROUND OF THE INVENTION

The present invention relates generally to high temperature superconductors. More specifically, the present invention relates to high grade thallium based superconductors.

Of course, the phenomenon of superconductivity has been known for a number of years. In contrast to normal electrical conductors, when an electrical field is applied to a superconducting material electrons flow with no measurable resistance.

Normal electrical conductors, such as copper or silver, permit electrons to flow easily within the bulk metal when an electrical field is applied. However, in bulk copper, for example, most of the atomic electrons are either bound closely to the nucleus by electrostatic attraction or participate in metal-metal bonds with neighboring atoms. Substantial energy is required to dislodge these core and valence band electrons. Accordingly, the electrons do not flow when an electrical field is applied, i.e., they do not participate in the electric current.

Conduction band electrons in copper and other metals move much more freely under an applied electrical field than do electrons in an insulated material such as plastic. But, the electrons in the current randomly collide with each other and with the vibrating metal crystal lattice. These collisions dissipate energy, introduce a small but measurable resistance to the electrical current, and can induce unwanted noise (random information) into sensitive electrical devices that are based on traditional conducting materials.

In contrast, superconducting materials allow electrons to flow with no measurable resistance. The physics of such superconducting materials is usually explained by a quantum mechanical model in which vibrations of the crystal lattice form electron pairs, in which all conduction band electrons are thus paired up. When an electric field is applied along the conducting plane of a superconducting crystal, the electron flow is coordinated both with other electrons in the current and with the vibrating crystal lattice. This causes a coordination of flowing electrons, not only with the electrons, themselves, but with the crystal lattice thereby eliminating the random collisions that lead to resistance. The result is resistant free current, or in other words superconductivity.

The phenomenon of superconductivity has been known for decades in certain materials when they are cooled close to absolute zero. However, at this temperature such products are impractical for commercial applications.

However, beginning approximately 10 years ago, superconducting materials were discovered that operated at finite temperatures, e.g., 20–100 K. These materials became known as high temperature superconductors.

High critical temperature (high $T_c$), superconductors are practical for commercial applications. For example, they can be cooled with liquid helium or inexpensive liquid nitrogen. Therefore they have been the subject of intense interest. In this regard, commercial products incorporating superconducting materials are well along in the development stage and even have begun to appear in the marketplace. An example of such a product is a commercial superconducting magnet offered by Cryomagnetics Inc.

A number of different materials (systems) have been found to have high temperature superconducting properties. These systems, for example, include: YBaCuO; TlBaCuO; TlSrCaCuO; TlBaCaCuO; and BiSrCaCuO.

Superconducting compounds with various compositions have been described in the literature for the fabrication of wires and tapes. Yttrium barium copper oxide in the composition $YBa_2Cu_3O_7$, has the best flux pinning property at high temperature (77 K) of all the copper oxide materials known so far. However, a high temperature (up to 950° C.), and the relatively long time required for the formation of the compound, as well as its ceramic nature, processing and the need for grain alignment (texturing) makes it difficult to draw in the form of long wires.

Thus, Tl-1223 has presently attracted attention to determine if it is a useful compound for fabrication into wires and tapes. The compositions that have been extensively studied are $Tl_{0.5}Pb_{0.5}Sr_{1.6}Ba_{0.4}Ca_2Cu_3O_9$, $Tl_{0.8}Bi_{0.2}Pb_{0.2}Sr_{1.6}Ba_{0.4}Ca_2Cu_3O_9$ and $TlBa_2Ca_2Cu_3O_9$. The former two phases require higher processing temperature. Also, single phase materials are never obtained and instead, Sr—Cu—O and Ca—Pb—O oxide containing phases are always noticed as an impurity with more than 15% abundance in the mixture. The latter phase has possible intergrowths of a Tl-2223 phase depending on the carbon content in the starting composition.

Thus, there is still a need for high quality high temperature superconducting materials that allow for an ease of formation at relatively low reaction temperatures making them more viable for practical applications.

SUMMARY OF THE INVENTION

The present invention provides a high temperature superconductor system comprising TlBiBaCaCuO. The new thallium based high temperature superconductor has enhanced flux pinning properties. The new material contains metal ions, (Tl, Bi), Ba, Ca, and Cu in the ratio 1:2:2:3. The partial substitution of bismuth for thallium increases the flux pinning properties and makes it an excellent choice for magnetic wire applications at moderate low temperatures. The transition temperature ($T_c$), increases from 110 K, for the unsubstituted compound, to 116 K for the Bi substituted phase. Bismuth substitution was also found to aid in the formation of plate-like morphology of the grains, and this is most suitable for powder-in-tube (PIT) and other methods for processing of wires. The process of making the superconductor and its properties are disclosed.

In an embodiment the high temperature superconductor system exhibits a superconducting transition temperature of 116 K.

In another embodiment the present invention provides a high temperature superconductor system having the stoichiometry: $Tl_{(1-X)}Bi_{(X)}Ba_2Ca_2Cu_3O_{9-Y}$ 0.0<x≦0.2; and 0.0≦y≦0.1.

In another embodiment the present invention provides a high temperature superconductor having the nominal composition $Tl_{0.8}Bi_{0.2}Ba_2Ca_2Cu_3O_y$ wherein: 8.9<y<9.1.

In yet another embodiment of the present invention a method for manufacturing superconductors is provided. The method comprising the steps of: mixing compounds including Tl, Bi, Ba, Ca, Cu, and O to create a mixture; heating the mixture; and cooling the mixture.

In an embodiment the mixture is pelletized prior to heating.

In an embodiment the mixture is heated to not more than 900° C.

In an embodiment the mixture is fabricated into a wire.

In an embodiment the mixture is heated for not more than 5 hours.

In an embodiment the mixture is heated for not more than 4 hours.

In still a further embodiment of the present invention, another method for manufacturing a high temperature superconducting system is provided. The method comprises the steps of: mixing compounds including Tl, Bi, Ba, Ca, Cu, and O to create a mixture; heating the mixture, in a single step, to no more than 900° C. for no more than 5 hours; and cooling the mixture.

It is an advantage of the present invention to provide a high quality new ceramic superconducting material.

Another advantage of the present invention is that it provides a material that provides for the ease of formation of the superconducting phase.

Still further, an advantage of the present invention is that it provides a process for the formation of the superconducting phase at relatively low reaction temperatures.

Additionally, an advantage of the present invention is that it provides a process for the formation of the superconducting phase using a relatively short heating time.

Further, an advantage of the present invention is that it provides a more viable superconductor and method for making same for practical commercial applications.

Moreover, an advantage of the present invention is that it provides a method for manufacturing high temperature superconductor systems using a single step.

Furthermore an advantage of the present invention is to provide a new Tl-based cuprate involving partial substitution at the Ti site, and a method for processing this new Tl-1223 material at lower processing temperatures.

Still, an advantage of the present invention is that the material can readily be made into a single phase.

Another advantage of the present invention is that a new material is provided that increases the flux pinning properties and thereby makes it a better choice for high current carrying capacity and wire applications.

Additionally, an advantage of the present invention is that it provides an insight into the strategy for achieving, by chemical substitution, a better superconducting material.

Additional features and advantages of the present invention are described in, and will be apparent from, the detailed description of the presently preferred embodiments from the drawings.

DETAILED DESCRIPTION OF THE PRESENTLY PREFERRED EMBODIMENTS

Figure 1:
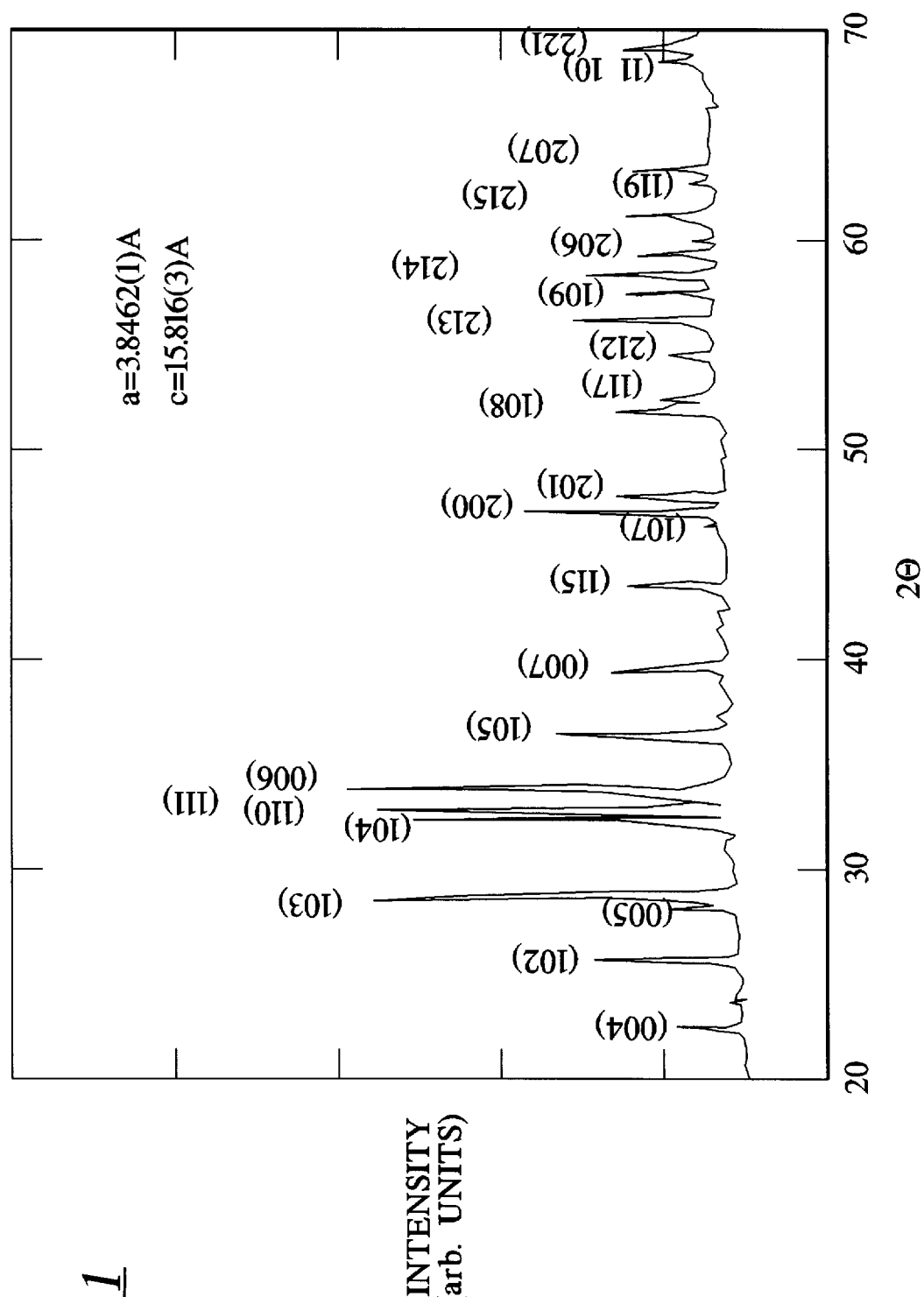
FIG. 1 illustrates the XRD pattern for the superconductor $Tl_{0.8}Bi_{0.2}Ba_2Ca_2Cu_3O_9$.

The present invention provides improved flux pinning property in a thallium based superconductor with a transition temperature of 116 K. A Ba- analogue of the Tl-1223 system is provided with partial bismuth substitution at the thallium site. In a preferred embodiment, the superconducting system of the present invention has the following stoichiometry:

$$Tl_{(1-x)}Bi_{(x)}Ba_2Ca_2Cu_3O_{9-y}$$

wherein: x is greater than 0.0 and less than or equal to 0.2; and y is plus or minus 0.1.

Generally, the synthesis involves mixing of the individual metal oxides: $Tl_2O_3$, $Bi_2O_3$, $BaO/BaO_2$, CaO and CuO in the preferred stoichiometry in an argon filled dried glove box. The mixture is heated in a quartz tube at a temperature ranging from approximately 820° to about 850° C. for approximately 3 to about 5 hours before cooling to room temperature. The nominal starting composition contains an amount of oxygen corresponding to y=±0.1.

The compound thus, produced was checked for single phase nature using x-ray diffractometer. The magnetic measurements were carried out using SQUID magnetometer (Quantum design—MPMS2).

The transition temperature and Meissner volume fraction were obtained by zero field cooled measurements. The samples were initially zero-field cooled before applying the field. The intragrain critical current density was estimated using Bean's critical model:

$$J_c = 30 \Delta M / d$$

where, $J_c$ is the current carrying capacity expressed as Ampere/Square cm, $\Delta M$ is the difference in magnetization with increasing and decreasing magnetic fields, and d is the average grain size obtained from scanning electron microscrope.

The basic concept of the Bean's critical state model is that penetrated supercurrents flow, within a superconductor, with a density equal to the critical current density, and that the flux vortex array is stable and there is no flux creep. If this magnitude of current flows everywhere in the specimen, it is in critical state. The critical current density, ($J_c$), is determined only by the value of magnetic induction, B, at that point. In general, the difference in magnetization ($\Delta M = M^{30} - M^-$) between the increasing and decreasing branches is related to the sample thickness and the critical current density, under the assumptions that the sample is an infinite thin plate and the critical current density is independent of the magnetic field.

To eliminate the effect of intergranular suppercurrent flow during the magnetic measurements, all the samples were thoroughly ground and uniformly dispersed in wax. Also, the symmetry of M vs H curve indicates bulk pinning nature only.

In the present system, the as synthesized compounds are black in color and are stable upon exposure to ambient atmospheric conditions. The compounds are single phase for x greater that 0.0 and less than 0.3 in $Tl_{(1-x)}Bi_{(x)}$ $Ba_2Ca_2Cu_3O_9$ system, the $x=0.0$ phase, i.e., $TlBa_2Ca_2Cu_3O_9$, has significant amount of $Tl_2Ba_2Ca_2Cu_3O_8$ phase intergrowth as indicated by the line broadening of the (001) line in the x-ray diffraction pattern. With, partial substitution of bismuth, $x=0.1-0.2$, the compound is highly single phase and has significantly sharp lines with the absence of 2223 phase intergrowths. As the proportion of Bi was increased above x greater than or equal to 0.3, the x-ray showed impurity phases arising from $BaBiO_3$.

The lattice parameter calculated from the x-ray showed significant reduction along the crystallographic 'c' direction demonstrating that bismuth substitutes at the thallium site. The superconducting phase having the composition $Tl_{0.8}Bi_{0.2}Ba_2Ca_2Cu_3O_9$ crystallizes in a tetragonal structure with unit cell constants a=3.846(1)A and c=15.816(3)A, while for the composition $TlBa_2Ca_2Cu_3O_9$, a=3.853(1)A and c=15.913(A). It was also found that the bismuth-substituted phases are insensitive to oxygen variation which reduces the complexity in processing.

Referring to the figures advantages and features of the present invention are illustrated.

FIG. 1 shows the XRD pattern for the superconductor $Tl_{0.8}Bi_{0.2}Ba_2Ca_2Cu_3O_9$. All the lines in the XRD pattern could be indexed based on a tetragonal symmetry with the space group P4/mmm.

Figure 2:
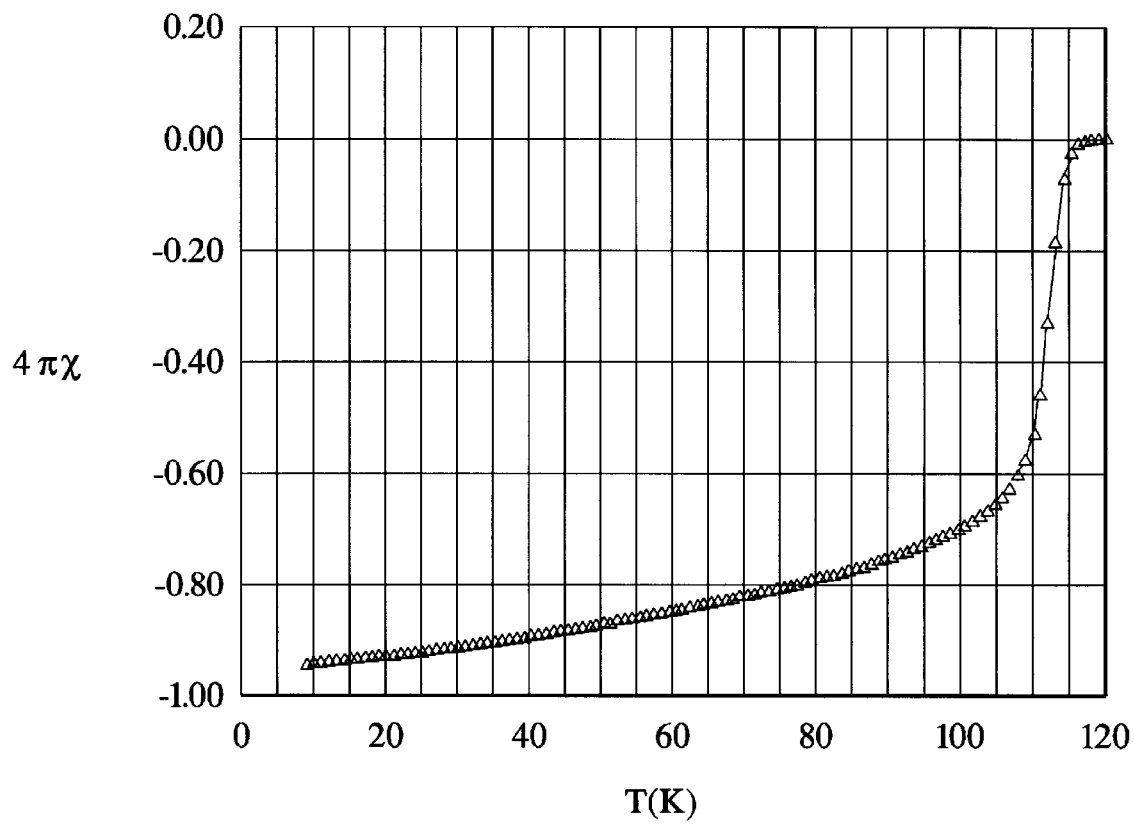
FIG. 2 illustrates the dc-susceptibility for the x=0.2 composition.

Referring to FIG. 2 the dc-susceptibility for the x=0.2 composition is illustrated. The transition from Pauli paramagnetic to bulk diamagnetic state is sharp with a clear $T_c$, onset at 116 K. There are no step behaviors indicating the absence of any secondary superconducting phases. The diamagnetic volume fraction estimated at 10 K is -95%.

Figure 3:
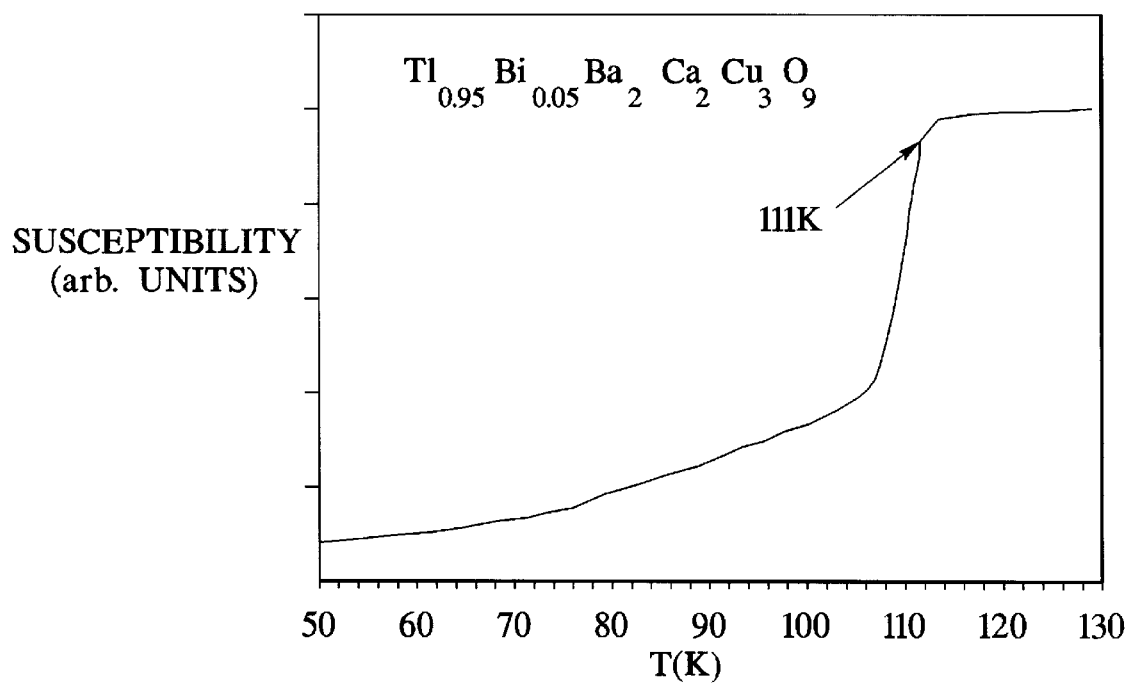
FIG. 3 illustrates the diamagnetic onset temperature for the composition $Tl_{1-x}Bi_xBa_2Ca_2Cu_3O_9$ wherein x=0.05.
Figure 4:
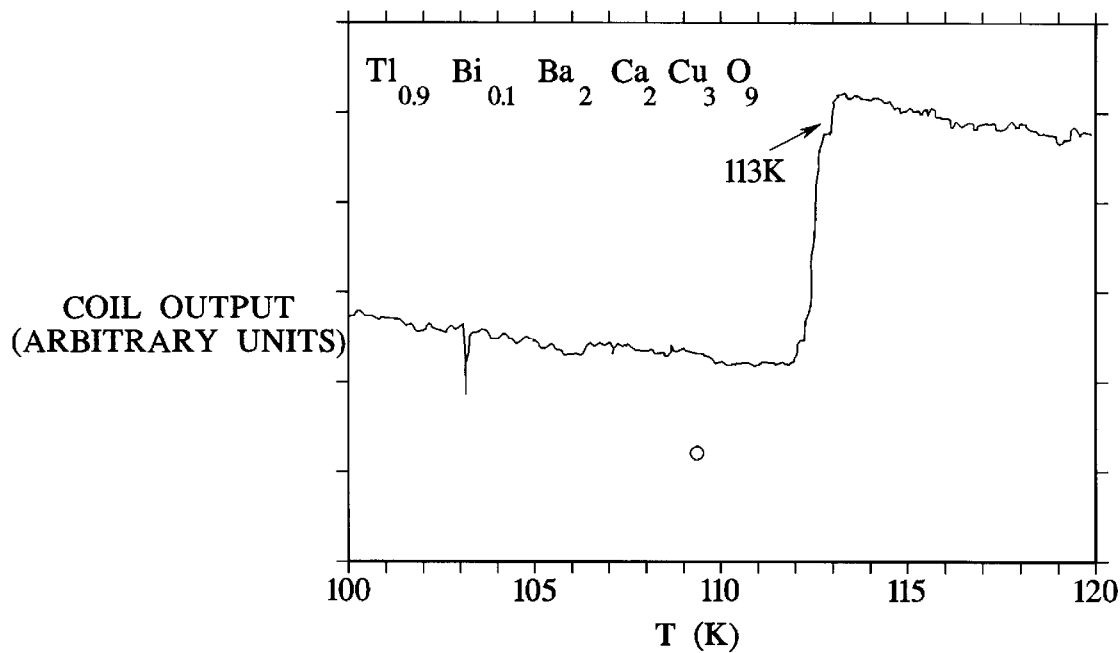
FIG. 4 illustrates the diamagnetic onset temperature for the composition $Tl_{(1-x)}Bi_{(x)}Ba_2Ca_2Cu_3O_9$ wherein x=0.10.

Illustrated in FIGS. 3 and 4 are the diamagnetic onset temperatures for the compositions x=0.05 and 0.10 respectively in the system, $Tl_{(1-x)}Bi_{(x)}Ba_2Ca_2Cu_3O_9$.

Figure 5:
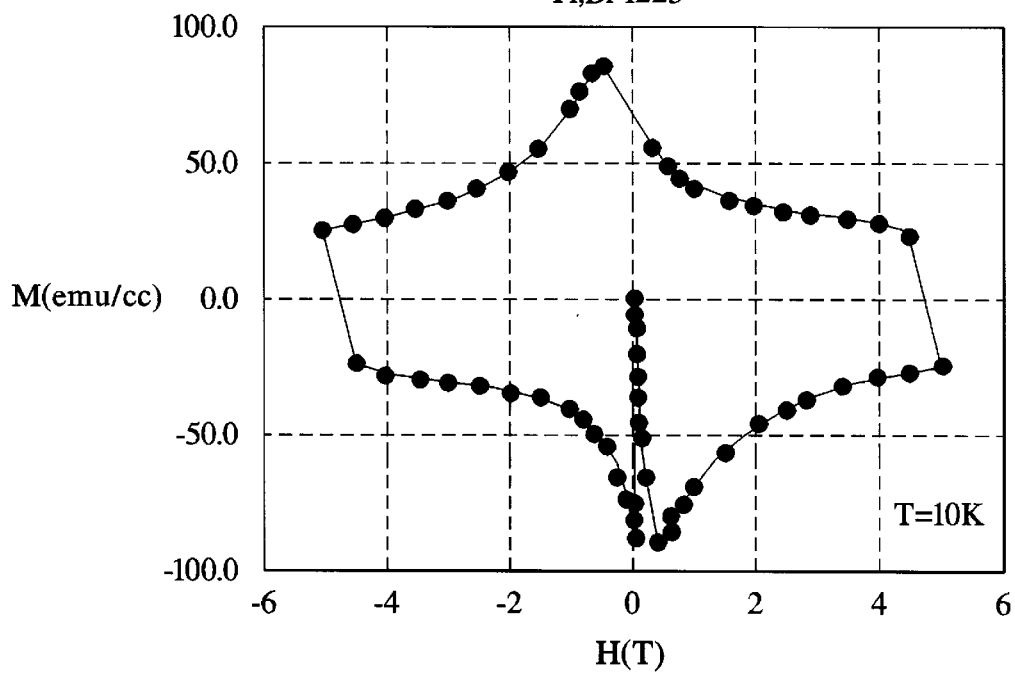
FIG. 5 illustrate the hysteresis magnetization, M vs. applied field H at 10 K for the as-synthesized compound, $Tl_{0.8}Bi_{0.2}Ba_2Ca_2Cu_3O_9$.
Figure 6:
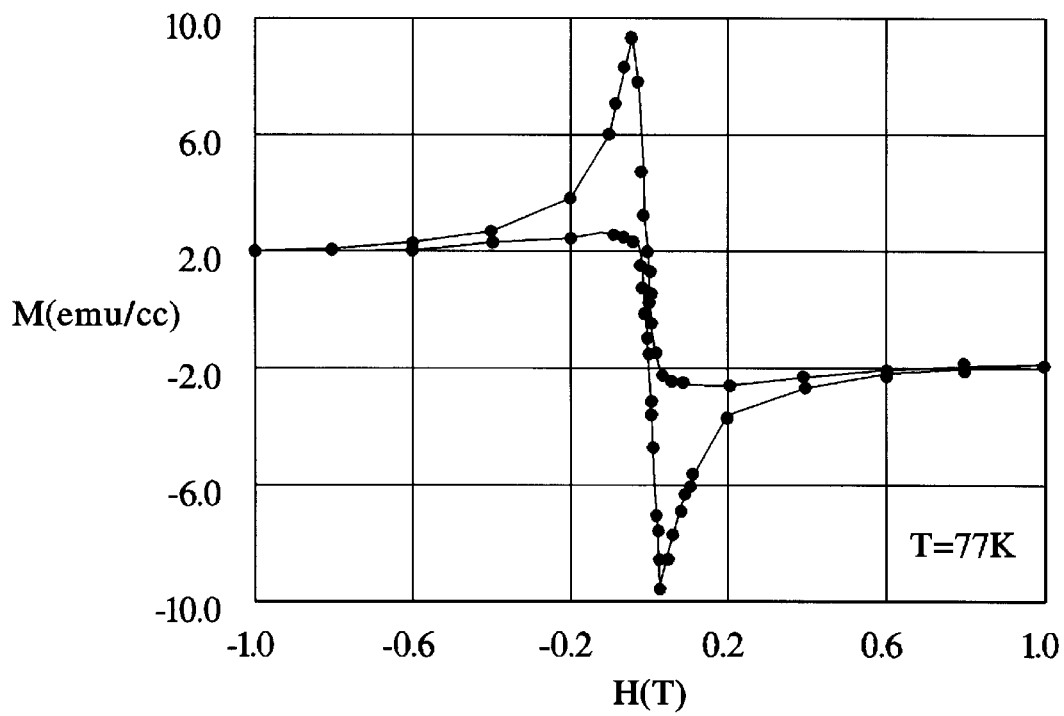
FIG. 6 illustrates the hysteresis magnetization, M vs. applied field H at 77 K for the as-synthesized compound, $Tl_{0.8}Bi_{0.2}Ba_2Ca_2Cu_3O_9$.

FIG. 5 and 6 shows the hysteresis magnetization, M vs. applied field H at 10 K and 77 K respectively for the as-synthesized compound, $Tl_{0.8}Bi_{0.2}Ba_2Ca_2Cu_3O_9$. In a preferred embodiment of the compounds of this invention, the ΔM, at 10 K, decreases only by a factor of approximately 2.5 between zero and five tesla. This reduction is significantly lower than any other of the thallium based superconductors.

Figure 7:
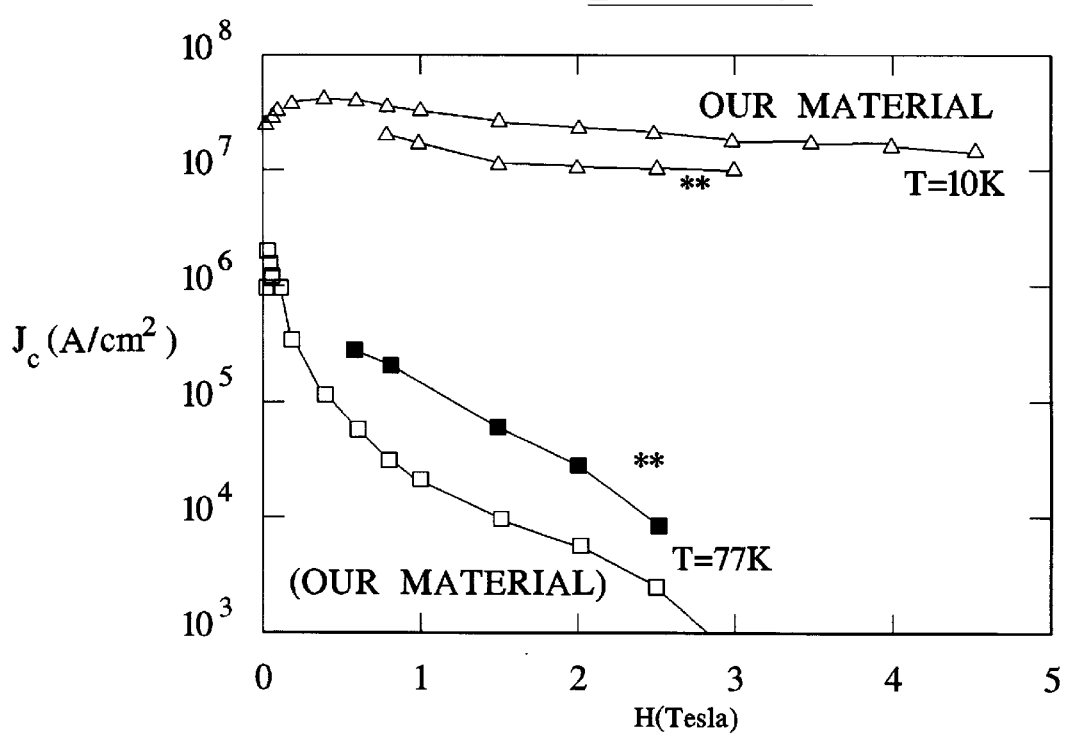
FIG. 7 illustrates the field and temperature dependence of $J_c$ values for the $Tl_{0.8}Bi_{0.2}Ba_2Ca_2Cu_3O_9$ material with comparison to other known copper oxide materials.

Referring to FIG. 7 the field and temperature dependence of $J_c$ are shown calculated from the magnetization measurements (using the Bean's Model); $J_c$=30ΔM/d. d is the average grain size of 1.0μm in the present compound as determined by the scanning electron microscopy.

Figure 8:
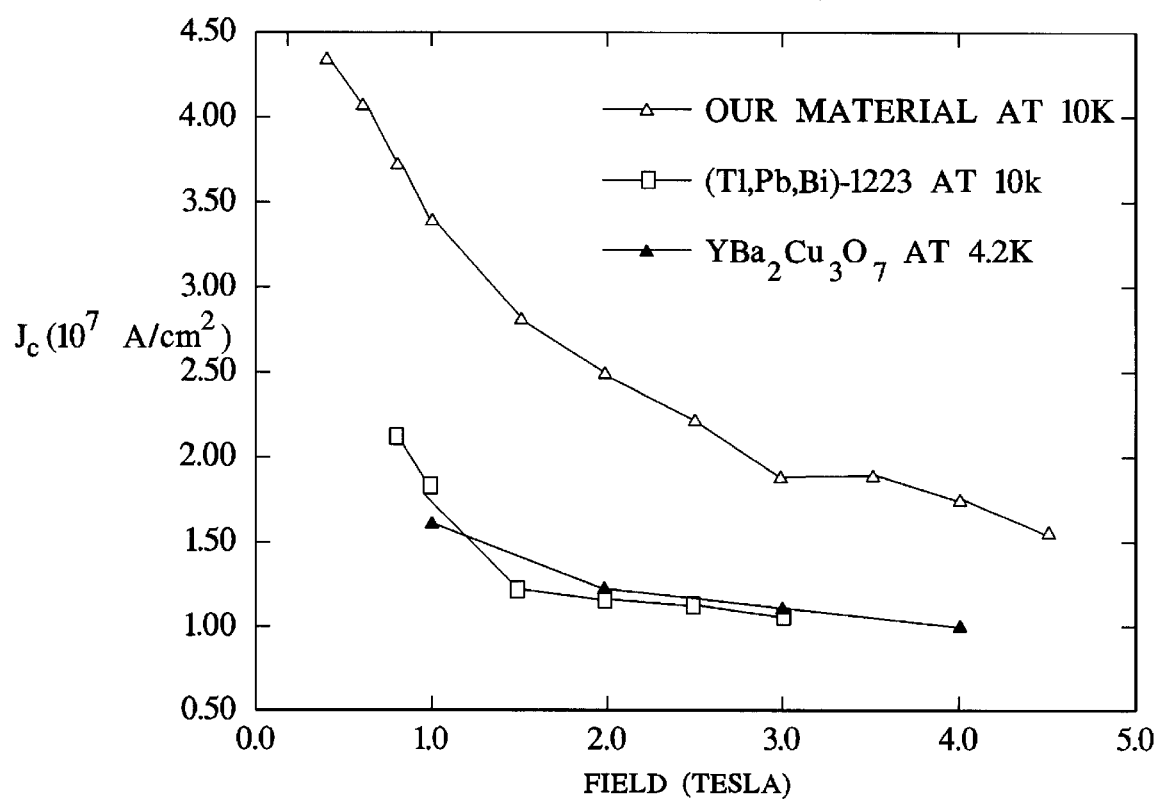
FIG. 8 illustrates $J_c$ values for the $Tl_{0.8}Bi_{0.2}Ba_2Ca_2Cu_3O_9$ material with comparison to other known copper oxide materials.
Figure 9:
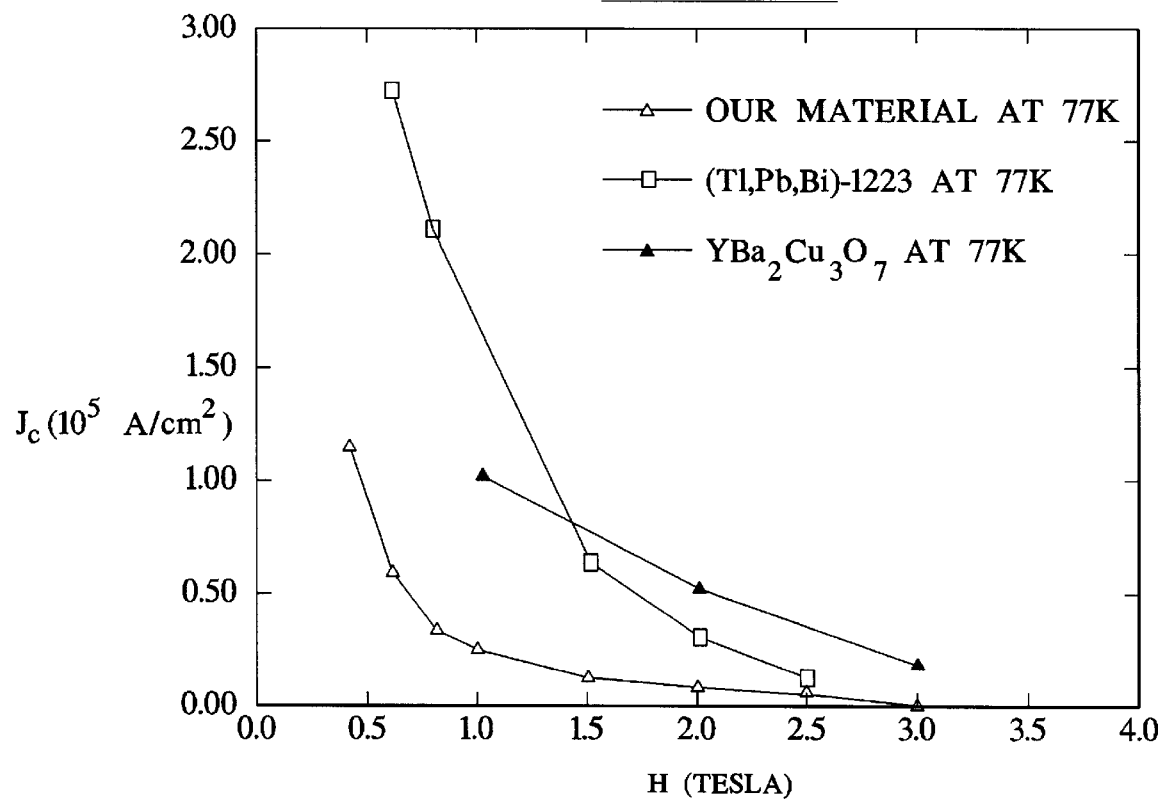
FIG. 9 illustrates $J_c$ values for the $Tl_{0.8}Bi_{0.2}Ba_2Ca_2Cu_3O_9$ material with comparison to other known copper oxide materials.

FIG. 8 and 9 shows the $J_c$ value for the $Tl_{0.8}Bi_{0.2}Ba_2Ca_2Cu_3O_9$ material. The material is compared to other best known copper oxide materials that are currently extensively studied. The $Tl_{0.8}Bi_{0.2}Ba_2Ca_2Cu_3O_9$ material shows an excellent performance at 10 K.

Figure 10A:
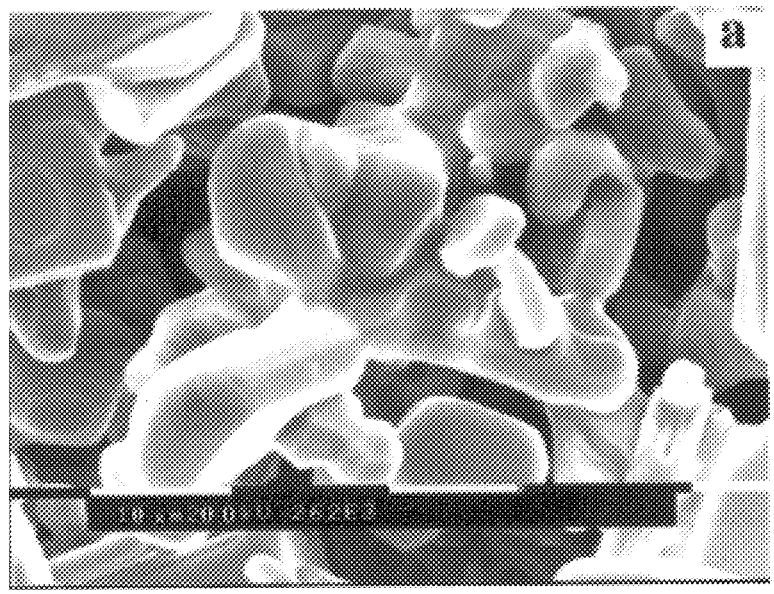
FIG. 10 illustrates SEM photomicrographs showing the morphology of $Tl_{0.8}Bi_{0.2}Ba_2Ca_2Cu_3O_9$.
Figure 10B:
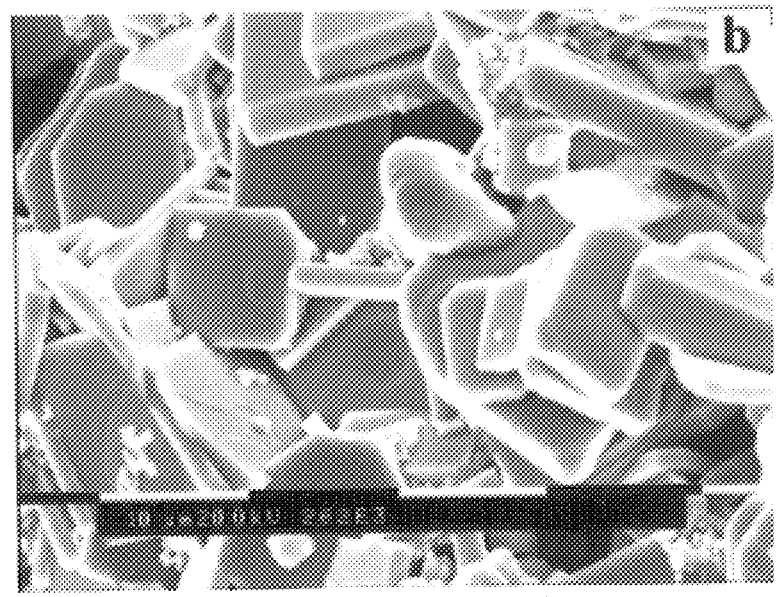

FIG. 10 sets forth the SEM photographs of the $Tl_{0.8}Bi_{0.2}Ba_2Ca_2Cu_3O_9$ material. The SEM photomicrographs showing the morphology of the majority of the grains to be plate-like. For practical wire applications of these bulk superconductors, both the intra- and inter- grannular coupling of the grains should be strong. The platelet-like morphology is best suited for accomplishing this constraint. In the present embodiment, bismuth substitution induces plate-like morphology of the majority of the grains.

One of the advantages of the superconducting system TlBiBaCaCuO is the ease of formation. The superconducting phase of the material can be formed at relatively low temperatures making it more viable for practical applications. In this regard, the material has been synthesized at temperatures around 800°–850° C. which is approximately 100° C. lower than the high $J_c$ Tl-based material $Tl_{0.6}Bi_{0.2}Ba_2Sr_{1.8}Ca_2Cu_3O_y$. The material has been synthesized as a pure phase in a single step involving a reaction time of approximately 4 to about 5 hours. In contrast the high $J_c$ phase $Tl_{0.6}Bi_{0.2}Ba_2Sr_{1.8}Ca_2Cu_3O_y$ has to be synthesized in a three step reaction so as to achieve a nearly single phase material.

It should be noted that the high $J_c$ realized in the Sr-analogues of the Tl-based cuprates has been attributed to the smaller size of the Sr compared to Ba. The reduction in the distance between the conducting Copper-oxide plane is believed to be the reason for the better coupling and high $J_c$.

In contrast, in the present invention the inventors have substituted smaller ionic radii Bi(5+) for the Tl-site. This has induced a small reduction in the unit cell. It is believed that the presence of Bi at the Tl-site may introduce pinning centers.

The critical current ($J_c$), of the TlBiBaCaCuO system is well above that of some other superconducting materials at the same operating temperature of 20 K. Of course, $T_c$ is the current below which a material operates as a superconductor, and above which the material loses its superconducting properties. A high critical current is desirable because its expands the operating range of a device based on the superconducting material. As illustrated in FIG. 7 at a preferred operating temperature of 10 K, the $Tl_{0.8}Bi_{0.2}Ba_2Sr_{1.8}Ca_2Cu_3O_y$ superconducting material can sustain a current two to three times greater than competing materials.

Another favorable feature of the TlBiBaCaCuO system is that it is formed by a process much simpler than that required for competing superconducting materials. For example, the TlBiBaCaCuO system can be synthesized with lower temperatures (which are less destructive) and fewer steps (which makes the process simpler and cheaper). The new material readily forms in platelets corresponding to the superconducting planes mentioned above. The implication is that it should be easier to form macroscopic-scale devices from such a material.

It is believed the TlBiBaCaCuO superconducting system can be formed into wires. It is further believed that the TlBiBaCaCuO superconducting system will be particularly useful in superconducting magnets. These devices use the superconducting property to generate high magnetic fields with low applied power and small size. Such superconducting magnets have applications in electromagnetic detectors, such as those used in telecommunications or medicine.

By way of example, and not limitation, examples of the present invention will now be given:

EXAMPLE No. 1

In order to conduct the following experiments, the results of which are graphically illustrated in the Figures, the following materials were created as follows.

1. Synthesis of ($Tl_{0.8}Bi_{0.2}Ba_2Ca_2Cu_3O_9$):

Stoichiometric amounts of $Tl_2O_3$, $Bi_2O_3$, $BaO/BaO_2$, CaO and CuO were mixed in a glove box. The mixture was pelletized. The pelletized mixture was sealed in an evacuated quartz tube and slowly heated to 820°–850° C. It was held at that temperature for 4 hours before being cooled to room temperature.

2. Synthesis of ($Tl_{0.6}Bi_{0.2}Pb_{0.2}Ba_{0.2}Sr_{1.8}Ca_2Cu_3O_y$):

Stoichiometric amounts of Sr, Ba, Ca carbonates were calcined with CuO at 980° C. in flowing oxygen for 48 hours with intermittent grindings. The above mixture was mixed with $Tl_2O_3$, PbO and $Bi_2O_3$ and heated at 940° C. for 3 hours in a mixed atmosphere of 25 bar He and 0.5 bar $O_2$. The product of this step was then given an $O_2$ treatment under $O_2$ flow at 870° C. for 5 hours. This was followed by a slow cooling to room temperature.

3. Synthesis of $YBa_2Cu_3O_7$ was pursuant to accepted standard methods in the literature.

EXAMPLE No. 2

A. In this example the following reagent oxides were utilized:
1. $Tl_2O_3$
2. $Bi_2O_3$
3. BaO
4. $BaO_2$
5. CaO
6. CuO B. To produce superconductors with these reagent the following procedures was followed:

1. BaO was obtained by decomposing $BaCO_3$ or $BaO_2$ at 975° C. under running vacuum of $10^{-2}$ Torr, for 40 hours.

2. CaO was obtained by decomposing $CaCO_3$ at 1000° C. for 24 hours.

3. The number of moles of $BaO/BaO_2$ was varied depending on the value of x in the system, $Tl_{(1-x)}Bi_{(x)}Ba_2Ca_2Cu_3O_9$, so that the final nominal oxygen content is 9.0.

For example, the following compounds were synthesized using the number of moles of the respective oxides as shown below:

(a) $Tl_{0.8}Bi_{0.2}Ba_2Ca_2Cu_3O_9$: 0.4 moles of $Tl_2O_3$, 0.1 mole of $Bi_2O_3$, 1.5 moles of BaO, 0.5 moles of $BaO_2$, 2 moles of CaO and 3 moles of CuO.

(b) $Tl_{0.9}Bi_{0.1}Ba_2Ca_2Cu_3O_9$: 0.45 moles of $Tl_2O_3$, 0.05 moles of $Bi_2O_3$, 1.5 moles of BaO, 0.5 moles of $BaO_2$, 2 moles of CaO and 3 moles of CuO.

(c) $Tl_{0.95}Bi_{0.05}Ba_2Ca_2Cu_3O_9$: 0.475 moles of $Tl_2O_3$, 0.025 moles of $Bi_2O_3$, 1.5 moles of BaO, 0.5 moles of $BaO_2$, 2 moles of CaO and 3 moles of CuO.

4. All the components are individually weighed in an argon filled dry box where the relative humidity level was less than 1%.

5. Special care was taken to avoid contamination of moisture and carbon dioxide of BaO since BaO absorbs moisture quickly.

6. All the components were ground in an agate pestle and mortar in the dry box for at least one hour.

7. After grinding, the mixture was pelletized using a stainless steel die. The typical size of the pellet is 1.5 inch in diameter and 2–3 mm thick.

8. The pellets were then wrapped with a gold foil and placed in a quartz tube to avoid the loss of $Tl_2O_3$ while processing.

9. The quartz tube was inserted in a tubular furnace and the temperature was ramped to 820°–850° C. in 2 to 3 hours and kept at the temperature for 4–5 hours and finally cooled to room temperature at a rate of 2°–3° C./min.

The sample prepared by this procedure had a $T_c$ onset of 116 K and exhibit a bulk diamagnetism with a volume fraction close to 95% at 10 K. The sample produced by this procedure also shows significant enhancement in the critical current density at low temperatures compared to any of the known high temperature superconductors.

The superconductors prepared by the above procedure were given an additional oxygen treatment. The compounds were placed in a tubular furnace in flowing oxygen at 350°–400° C. for 4 hours and cooled to room temperature slowly under flowing oxygen. The resultant compounds did not show any appreciable changes in the physical properties showing that the as synthesized compound itself is saturated well with the oxygen content.

From the data in the foregoing example, it is seen that the present invention provides a simplified method for preparing a superconducting material with a higher transition temperature and enhanced flux pinning properties. Furthermore, the morphology of the bismuth substituted compounds is platelet-like, more suited for powder-in-tube and other processing techniques for fabrication of superconducting wires.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A high temperature superconductor system comprising a single phase composition having the nominal composition $Tl_{(1-x)}Bi_{(x)}Ba_2Ca_2Cu_3O_{9-y}$ wherein $0.0 < x \leq 0.2$, and $0.0 \leq y \leq 0.1$.

2. The high temperature superconductor system of claim 1 wherein the superconductor exhibits a superconducting transition temperature of 116 K.

3. The high temperature superconductor of claim 1 wherein the superconducting volume fraction is approximately 95%.

4. A high temperature superconductor comprising a single phase composition having the nominal composition $Tl_{0.8}Bi_{0.2}Ba_2Ca_2Cu_3O_y$ wherein: $8.9 \leq y \leq 9.1$.

5. The high temperature superconductor of claim 4 wherein the superconducting volume fraction is approximately 95%.

* * * * *